(12) United States Patent
Brossard

(10) Patent No.: US 10,319,135 B2
(45) Date of Patent: Jun. 11, 2019

(54) COMPUTER-IMPLEMENTED METHOD FOR SIMULATING A BODY TAKING A POSTURE, IN PARTICULAR TO LOOK AT A TARGET

(71) Applicant: Dassault Systemes, Velizy Villacoublay (FR)

(72) Inventor: Mickaël Brossard, Vélizy-Villacoublay (FR)

(73) Assignee: Dassault Systemes, Velizy Villacoublay (FR)

( * ) Notice: Subject to any disclaimer, the term of this patent is extended or adjusted under 35 U.S.C. 154(b) by 39 days.

(21) Appl. No.: 15/811,244

(22) Filed: Nov. 13, 2017

(65) Prior Publication Data

US 2018/0144532 A1    May 24, 2018

(30) Foreign Application Priority Data

Nov. 22, 2016 (EP) ..................... 16306532

(51) Int. Cl.
G06T 13/40 (2011.01)
G06F 17/50 (2006.01)

(52) U.S. Cl.
CPC .......... *G06T 13/40* (2013.01); *G06F 17/5009* (2013.01)

(58) Field of Classification Search
None
See application file for complete search history.

(56) References Cited

U.S. PATENT DOCUMENTS

| 6,088,042 | A  | * | 7/2000 | Handelman ............. G06T 13/40 345/473 |
| 6,191,798 | B1 |   | 2/2001 | Handelman et al. |
| 6,400,368 | B1 |   | 6/2002 | Laperriere |
| 6,535,215 | B1 |   | 3/2003 | Dewitt et al. |

(Continued)

OTHER PUBLICATIONS

Petsch, Susanne, and Darius Burschka. "Estimation of inverse kinematics of arbitrary serial chain manipulators and human-like robotic hands." Advanced Intelligent Mechatronics (AIM), 2013 IEEE/ASME International Conference on. IEEE, 2013.*

(Continued)

*Primary Examiner* — Zhengxi Liu
(74) *Attorney, Agent, or Firm* — Hamilton, Brook, Smith & Reynolds, P.C.

(57) ABSTRACT

A computer-implemented method for simulating a human or animal body taking a posture, comprising the steps of: a) providing a model (AV) of said human or animal body, including a skeleton comprising a plurality of bones articulated by rotational joints to form at least one kinematic chain; b) defining a starting position and a starting rotational state for each rotational joint of the skeleton, a target point (T) and a bone, called end bone, of a kinematic chain, called active kinematic chain; c) for a set of bones of the active kinematic chain, including the end bone, defining at least one axis (GZ) having a fixed orientation with respect to the bone; d) determining a first posture of the body by performing bounded rotations of a set of joints of the active kinematic chain; and e) determining a second posture of the body by iteratively by performing bounded rotations of a set of joints of the active kinematic chain in order to direct a selected axis (GZ) of the end bone toward the target.

11 Claims, 4 Drawing Sheets

(56) References Cited

U.S. PATENT DOCUMENTS

| | | | | |
|---|---|---|---|---|
| 6,738,065 | B1* | 5/2004 | Even-Zohar | G06Q 30/06 345/473 |
| 9,001,132 | B1* | 4/2015 | Wooley | G09G 5/00 345/474 |
| 2001/0019333 | A1* | 9/2001 | Sasaki | A63F 13/10 345/653 |
| 2005/0278157 | A1 | 12/2005 | Raschke | |
| 2007/0200854 | A1* | 8/2007 | Gordon | G06F 3/011 345/474 |
| 2008/0309664 | A1* | 12/2008 | Zhou | G06T 13/40 345/420 |
| 2013/0141431 | A1* | 6/2013 | Kawakami | G06T 13/40 345/419 |
| 2016/0307354 | A1* | 10/2016 | Baur | G06T 13/40 |
| 2016/0335790 | A1* | 11/2016 | Fleishman | G06K 9/00355 |
| 2016/0371871 | A1* | 12/2016 | Aguado | G06T 13/20 |
| 2017/0169138 | A1* | 6/2017 | Lemieux | G06F 17/5009 |
| 2017/0221250 | A1* | 8/2017 | Aguado | G06T 13/40 |
| 2018/0144533 | A1 | 5/2018 | Brossard | |

OTHER PUBLICATIONS

Cheng, Fan-Tien, Tsing-Hua Chen, and York-Yih Sun. "Resolving manipulator redundancy under inequality constraints." IEEE Transactions on Robotics and Automation 10.1 (1994): 65-71.*

Huang, Jing, et al. "Inverse kinematics using dynamic joint parameters: inverse kinematics animation synthesis learnt from subdivided motion micro-segments." The Visual Computer 33.12 (2017): 1541-1553.*

Ersu, E., and D. Nungesser. "A numerical solution of the general kinematic problem." Robotics and Automation. Proceedings. 1984 IEEE International Conference on. vol. 1. IEEE, 1984.*

Badler, Norman, Kamran Manoochehri, and Graham Walters. "Articulated figure positioning by multiple constraints." IEEE Computer Graphics and Applications 6 (1987): 28-38.*

Matsemann, "Set resting length for a generic spring constraint", published on Jan. 28, 2015, retrieved from https://blender.stackexchange.com/questions/23925/set-resting-length-for-a-generic-spring-constraint on Feb. 1, 2019.*

Autodesk Maya, "Understanding the attributes of a joint", published in 2017, retrieved from http://help.autodesk.com/view/MAYAUL/2017/ENU/?guid=GUID-5A8BB621-96E0-4CE8-9792-085EC8F07164 on Feb. 1, 2019.*

Autodesk Maya, "Joint", published in 2017, retrieved from http://help.autodesk.com/view/MAYAUL/2017/ENU/?guid=GUID-8CE29E9D-F1C5-42A3-A657-33E32887380A.*

European Search Report for EP Application No. 16306533.7, entitled "Computer-Implemented Method for Simulating a Body Taking a Posture, in Particular to Look at a Target", dated May 8, 2017.

European Search Report for Int'l Application No. EP 16 30 6532, entitled "Computer-Implemented Method for Simulating a Body Taking a Posture, in Particular to Look at a Target," dated Apr. 27, 2017.

* cited by examiner

COMPUTER-IMPLEMENTED METHOD FOR SIMULATING A BODY TAKING A POSTURE, IN PARTICULAR TO LOOK AT A TARGET

RELATED APPLICATION

This application claims priority under 35 U.S.C. § 119 or 365 to European Application No. 16306532.9, filed Nov. 22, 2016. The entire teachings of the above application are incorporated herein by reference.

FIELD OF INVENTION

The invention relates to a computer-implemented method for simulating the motion of a human being (or animal) taking a posture, in particular to look at a target or more generally to turn a body part towards it.

It relates to the field of computer graphics and it lends itself to several applications such as Computer Aided Design (CAD), ergonomics, video games, etc.

BACKGROUND

It is known to represent human or animal bodies by digital models comprising a "skeleton" covered by a "skin". The skeleton is constituted by a set of segments, called "bones" even if they do not necessarily correspond to actual anatomical bones, articulated by rotational joints having one, two or three rotational degrees of freedom. Such models, also known as "avatars", are usually provided in standard postures, such as the so-called "T-pose" (partially spread legs, arms extended horizontally) for human body models.

In order to make the avatar take a particular posture different from the original one, it is necessary to determine a set of rotations of the joints articulating the bones of its skeleton leading to the desired result. This is not an easy task.

In many cases, instead of fully specifying the desired posture, one only imposes a constraint on one or more particular points (called "effectors") of the skeleton. For instance, one may impose that a hand of the avatar (e.g. corresponding to the endpoint of a bone representing its forearm) takes a particular position. From a theoretical standpoint, this corresponds to the problem of inverse kinematics (IK). Several algorithms exist for solving this problem.

SUMMARY

The present invention deals with a different case, wherein the body takes a particular posture in order to direct its gaze towards a particular direction, or to look at a target. In practice, for a human body, this involves turning the head, the spine and sometimes the lower body and/or the eyes. From a theoretical standpoint, this corresponds to the problem of determining the rotations of the joints providing a desired orientation of an axis affixed to a specific segment (typically the last one) of the kinematic chain. In the following, the segment to be oriented will be referred to as the "end bone", even if it is not necessarily the last bone of the kinematic chain.

As in standard inverse kinematic, there are usually an infinite number of sets of joint rotations (a "solution space") which allow achieving the desired orientation, and one has to choose a solution which satisfies a particular set of requirements. The invention aims at providing a realistic—albeit not necessarily anatomically accurate—solution to the gaze direction. Indeed, the scope of the invention is larger as it can be applied each time an avatar has to orient a part of its body toward a target without necessarily approaching it.

An object of the present invention, allowing achieving this aim, is a computer-implemented method for simulating a human or animal body taking a posture, comprising the steps of:

a) providing a model of said human or animal body, including a skeleton comprising a plurality of bones articulated by rotational joints to form at least one kinematic chain, each rotational joint connecting two bones and having a number of rotational axes comprised between one and three;

b) defining a starting position and a starting rotational state for each rotational joint of the skeleton, a target point and a bone, called end bone, of a kinematic chain, called active kinematic chain;

c) for a set of bones of the active kinematic chain, including the end bone, defining at least one axis having a fixed orientation with respect to the bone;

d) determining a first posture of the body by:
  d1) selecting a first ordered list of joints of the active kinematic chain, a rotational axis for each of said rotational joints, a bone articulated by each of said joints and an axis for each of said bones;
  d2) for each of said rotational axes, defining a maximal fractional contribution to a target rotation and a maximal rotation angle;
  d3) applying to each of the selected rotational joints, taken in the order of the list, a rotation about the corresponding rotational axis in order to direct the selected axis of the corresponding bone toward the target, the rotation being bounded by one among the corresponding maximal rotation angle and the corresponding maximal fractional contribution to the target rotation which would orientate the selected axis exactly toward the target;

e) determining a second posture of the body by:
  e1) selecting an axis of the end bone;
  e2) selecting a second ordered list of joints of the active kinematic chain;
  e3) for each of said rotational joints, defining a rotational axis, a maximal fractional contribution to a target rotation and a maximal rotation angle;
  e4) iteratively applying to each of the selected rotational joints, taken in the order of the list, a rotation about the corresponding rotational axis in order to direct the selected axis of the end bone toward the target, the rotation being bounded by one among the corresponding maximal rotation angle and the corresponding maximal fractional contribution to the target rotation which would orientate the axis exactly toward the target.

Another object of the invention is a computer program product, stored on a non-transitory computer-readable data-storage medium, comprising computer-executable instructions to cause a computer system to carry out such a method.

Yet another object of the invention is a non-transitory computer-readable data-storage medium containing computer-executable instructions to cause a computer system to carry out such a method.

A further object of the invention is a computer system comprising a processor coupled to a memory and a graphical user interface, the memory storing computer-executable instructions to cause the computer system to carry out such a method.

Another object of the invention is a model of a human or animal body taking a posture simulated with such a method.

Additional features and advantages of the present invention will become apparent from the subsequent description, taken in conjunction with the accompanying drawings, wherein:

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

The teachings of all patents, published applications and references cited herein are incorporated by reference in their entirety.

The invention will be described with reference to a very simple example, illustrated on FIG. 1: a kinematic chain consisting of four bones b1, b2, b3, b4, a fixed base b0 (which can be considered to be a bone) and four rotational joints A, B, C, D each having a single rotational axis. The rotational axes are parallel to each other; therefore the movement of the chain is constrained in a plane. Each bone but the base is associated to one or more axes having a fixed orientation with respect to it. In the exemplary embodiment of the invention, each bone "bi" (i=1-4) is associated to an axis Xi perpendicular to it and an axis Yi parallel to it: b1 is associated to X1 and Y1, b2 is associated to X2 and Y2, b3 is associated to X3 and Y3, b4 is associated to X4 and Y4 (in general, the axes may have arbitrary orientations with respect to the bones, they need not being parallel or perpendicular to them as in this example). In this specific case, the aim will be to orientate the Y4 axis, parallel to the end bone b4, towards a target point T. Contrarily to the standard inverse kinematic problem, it is not required that the end point of this bone touches the target: only the orientation matters.

Figure 1:
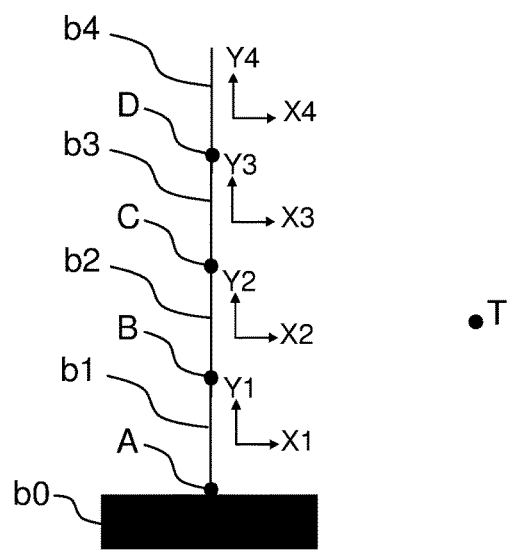
FIGS. 1, 2A, 2B, 3A, 3B, 4A, 4B, 5A and 5B illustrate the sequence of rotations applied to a kinematic chain of a skeleton in order to orient an axis affixed to an end segment thereof towards a target according to an exemplary embodiment of the inventive method.

FIG. 1 represents the kinematic chain in an initial posture, wherein all the joints have a 0° initial rotational angle, and all the bones are aligned.

The inventive method comprises three phases, the third of which may be optional.

The first phase leads to a first "intermediate" posture, which serves as a starting point for the second one.

Before actually carrying out this first phase, it is necessary to create a simple data structure: an ordered list of elements, each element comprising:
- an identifier of a joint and of a rotational axis thereof;
- an identifier of an axis associated to a bone articulated by said joint;
- a numerical value indicative of the maximal fractional contribution of the joint to a target rotation; and
- a numerical value indicative of the maximal rotation angle of the joint.

The table 1 below provides an example of such a list; however, there are no identifiers of the rotational axes of the joints as only one degree-of-freedom joints are considered in the example of FIG. 1.

| Joint | Bone/Axis | Max. fractional contribution | Max. rotation angle |
| --- | --- | --- | --- |
| B | X2 | 30% | 20° |
| D | Y4 | 50% | 20° |

In this exemplary embodiment, the aim of the first phase of the inventive method is to create an initial posture for the second phase. In order to do that, this phase directs the X axis of bone b2 (first step) and the Y axis of bone b4 (the end bone) towards the target T—but not completely, as the rotations of the relevant joints are bounded by the "maximal fractional contribution" and by the "maximal rotation angle" parameters.

Figures 2A, 2B:
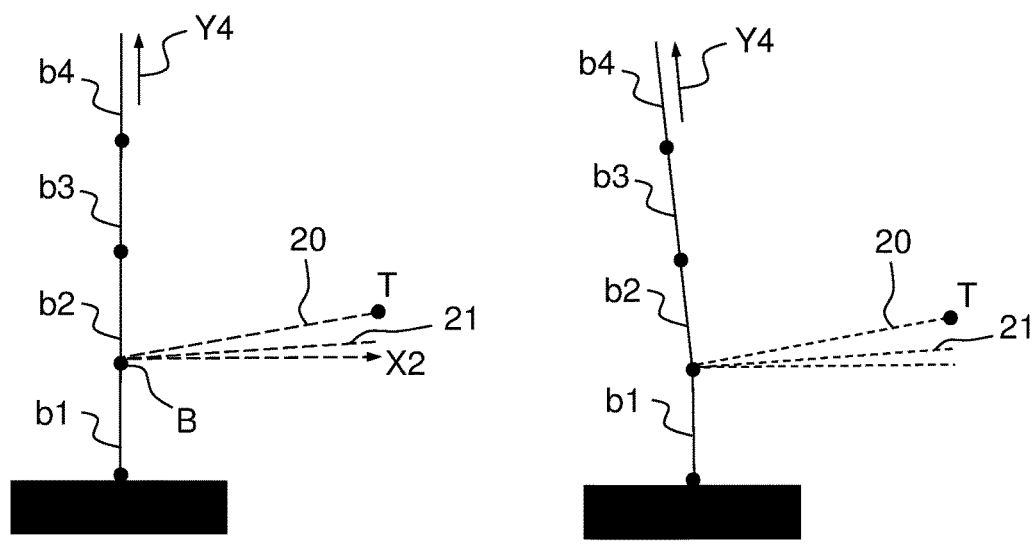

The first element of the list corresponds to joint B. The first step of the first phase consists then in rotating this joint in order to turn the X2 axis of bone b2 towards the target T. On FIG. 2A, dashed line 20 connects joint B to the target. A "full" rotation of the joint would make the axis X2 of bone b2 parallel to line 20. However, the list shows that joint B is characterized by a maximal fractional contribution of 30% and a maximal rotation angle of 20°. This means that the actual rotation of the joint is limited to either 30% of the "full" rotation (see dashed line 21) or to a rotation of 20° (not represented). As a rule, the larger of the two bounds is chosen. In this case, indeed, a rotation of 10° is sufficient to align the X2 axis to the target, therefore the full rotation is actually performed. The resulting configuration ("posture") is shown on FIG. 2B.

Figure 3A:
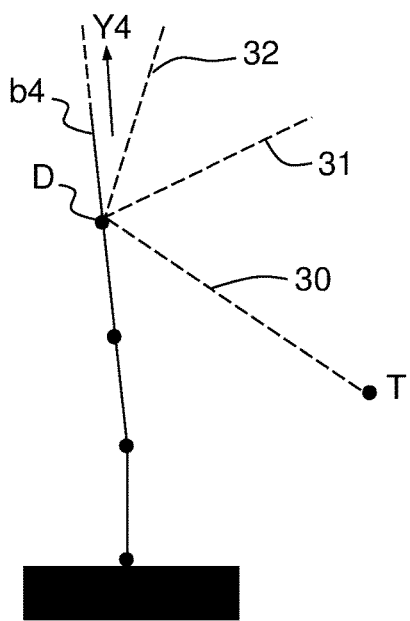
Figure 3B:
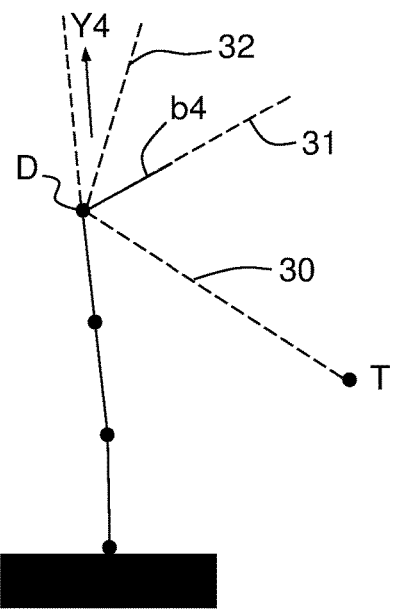

The following joint to be actuated is D, in order to direct the Y4 axis of bone b4 towards the target. On FIG. 3A, line 30 connects joint D to the target. A "full" rotation of the joint would make the axis Y4 of bone b4 parallel (actually, superposed) to line 30. However, the list shows that joint D is characterized by a maximal fractional contribution of 50% and a maximal rotation angle of 20°. This means that the actual rotation of the joint is limited to either 50% of the "full" rotation (see dashed line 31) or to a rotation of 20° (see dashed line 32). The larger of the two bounds is chosen, which in this case is the maximal fractional contribution; therefore axis Y2 is aligned with line 31, as shown on FIG. 3B.

It can be seen that, at the end of the first phase, the kinematic chain is still far from the desired posture. The second phase allows approaching (but not always reaching) it.

Before actually carrying out this second phase, it is necessary to create another simple data structure. It is an ordered list of elements, each element comprising:
- an identifier of a joint and of a rotational axis thereof;
- a numerical value indicative of the maximal fractional contribution of the joint to a target rotation; and
- a numerical value indicative of the maximal rotation angle of the joint.

The table 2 below provides an example of such a list; however, there are no identifiers of the rotational axes of the joints as only one degree-of-freedom joints are considered in the present example.

TABLE 2

| Joint | Max. fractional contribution | Max. rotation angle |
|---|---|---|
| D | 30% | 10° |
| B | 50% | 50° |
| ... | ... | ... |

Basically, each element of the second list contains the same items of information as an element of the first list except the identification of the axis affixed to a bone. However, the joints and rotational axis belonging to the two lists are not necessarily the same, nor are the numerical values of the maximal fractional contributions and of the maximal rotation angles.

This second phase only aims at directing one axis (here, the Y axis) of the end bone (b4) towards the target. It is carried out iteratively, by rotating the joints in the order of the list, taking into account the bounds expressed by the "maximal fractional contribution" and by the "maximal rotation angle" parameters.

Figure 4A:
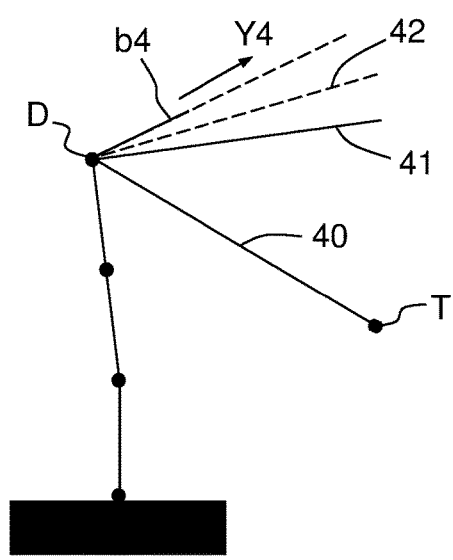
Figure 4B:
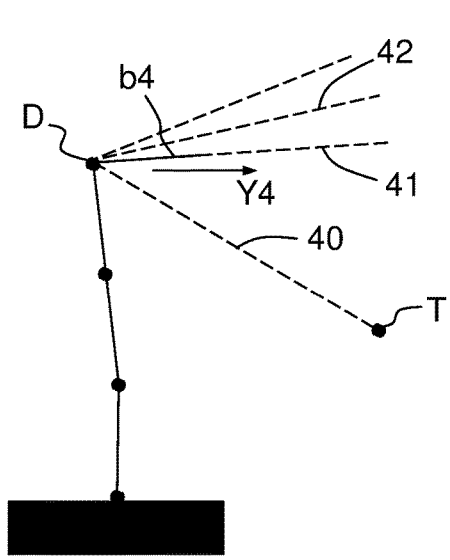

The first element of the list corresponds to joint D. The first step of the second phase consists in rotating this joint in order to turn the Y4 axis towards the target. On FIG. 4A dashed line 40 represents a full rotation, dashed line 41 a rotation bounded by the maximal fractional contribution (30% of the full rotation) and dashed line 42 a rotation bounded by the maximum rotation angle (10°). The larger of the two bounds is chosen, which in this case is the maximal fractional contribution. Therefore the axis Y4 is aligned with line 41 (see FIG. 4B).

Figure 5A:
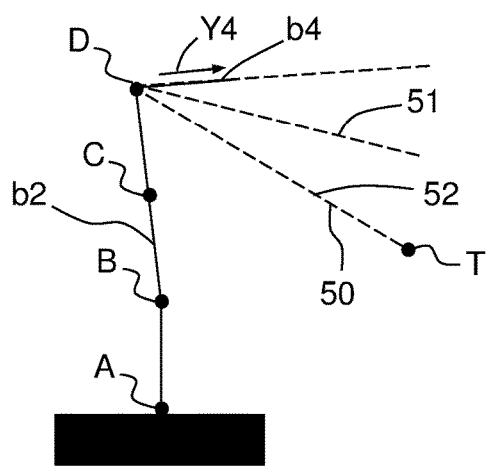
Figure 5B:
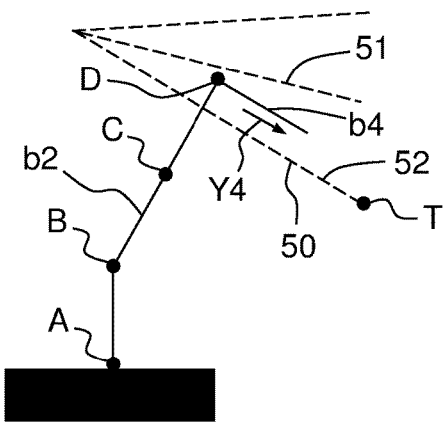

The second element of the list corresponds to joint B. The second step of the second phase consists in rotating this joint in order to turn the Y4 axis towards the target. On FIG. 5A dashed line 50 represents a full rotation, which has a 30° amplitude, dashed line 51 a rotation bounded by the maximal fractional contribution (50% of the full rotation) and dashed line 52 a rotation bounded by the maximum rotation angle (50°), yet not exceeding the amplitude of the full rotation (i.e. 30°). The larger of the two bounds is chosen, which in this case is the maximal rotational angle. Therefore the axis Y4 is aligned with line 52 (see FIG. 5B).

In this exemplary embodiment of the invention, the second phase of the algorithm ends here. In more complex embodiments, joints A and C could also be actuated and/or several iterations could be performed, i.e. the joints of the list could be processed several times. In any case, convergence is not guaranteed. This is why a third and final phase may be carried out, which simply consists in performing a full (unbounded) rotation to exactly orient the Y4 axis towards the target. In fact, in most actual implementation, a "hard bound" will be associated to each rotational axis of each joint of the skeleton, which cannot be exceeded in any case. Due to this constraint, it could turn out to be impossible to exactly orient the Y4 axis towards the target with a single rotation of joint D. In this case, the third and final phase will generally carried out iteratively, performing a full (only limited by the above-mentioned "hard bound") rotation of the joints starting from the final one (D) towards the first one (A), and stopping when the desired orientation has been achieved.

Until now, only the case of an "abstract" kinematic chain has been considered. In actual implementations of the method, the kinematic chain will represent a part of a skeleton corresponding e.g. to the spine and the head of an avatar.

Until now, moreover, only the case wherein the larger of the maximal rotation angle and of the corresponding maximal fractional contribution to the target rotation is chosen to bound the rotation of the joint. This choice accelerates the convergence. However, the opposite choice (i.e. the smaller of the maximal rotation angle and of the corresponding maximal fractional contribution to the target rotation) is also possible. It is also possible to adopt a "hybrid" approach, e.g. to choose the larger bound for the first phase and the smaller bound for the second phase, or vice-versa. It is also possible to choose the larger bound for the first iteration(s) of the second phase and the smaller one for the last one(s).

When the method is applied to an avatar, moreover, it may be necessary to impose additional constraints to the rotations of the joints, reflecting physiological constraints of the modeled human or animal body. These constraints are implemented by the above-referenced "hard bounds" on rotations.

Figures 6A, 6B, 6C:
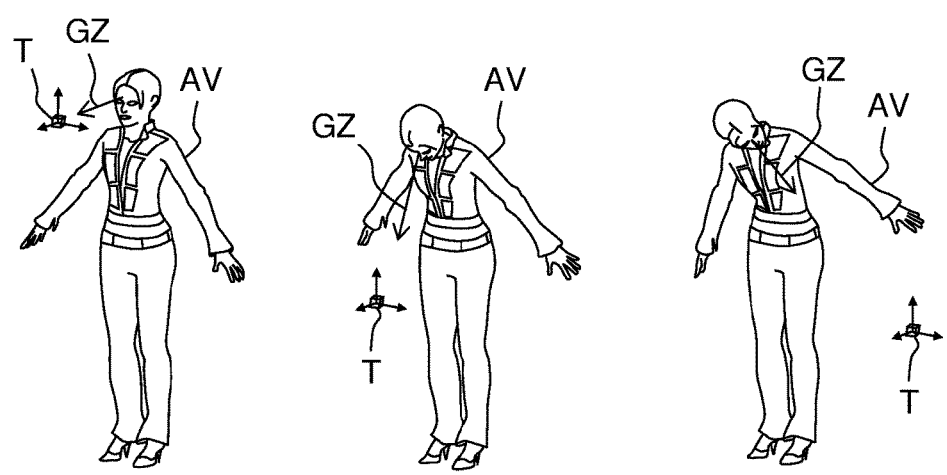
FIGS. 6A-6C show an exemplary application of the inventive method.

FIGS. 6A-6C shows an avatar AV having a skeleton (not represented) comprising a plurality of kinematic chains. Only the chain comprising the spine and the head is considered; the rest of the body constitutes a fixes base. The end bone represents the head and has a perpendicular axis GZ representing the gaze direction.

The target T consists of a cursor which is moved by a user, using e.g. a mouse, in a three-dimensional scene containing the avatar. As it can be seen, repeatedly carrying out the inventive method for successive positions of the target allows the gaze direction to follow it in real time, and the posture of the avatar always looks very natural.

It is important to note that, while the final posture is realistic, the movements performed by the kinematic chain to reach it are not necessarily so, except for small changes of orientation. Therefore, it the inventive method is used to perform an animation, it is advised to start with a target point almost aligned with the initial gaze direction and to move it gradually toward it final position.

The inventive method can be performed by a suitably-programmed general-purpose computer or computer system, possibly including a computer network, storing a suitable program in non-transitory form on a computer-readable medium such as a hard disk, a solid state disk or a CD-ROM and executing said program using its microprocessor(s) and memory.

Figure 7:
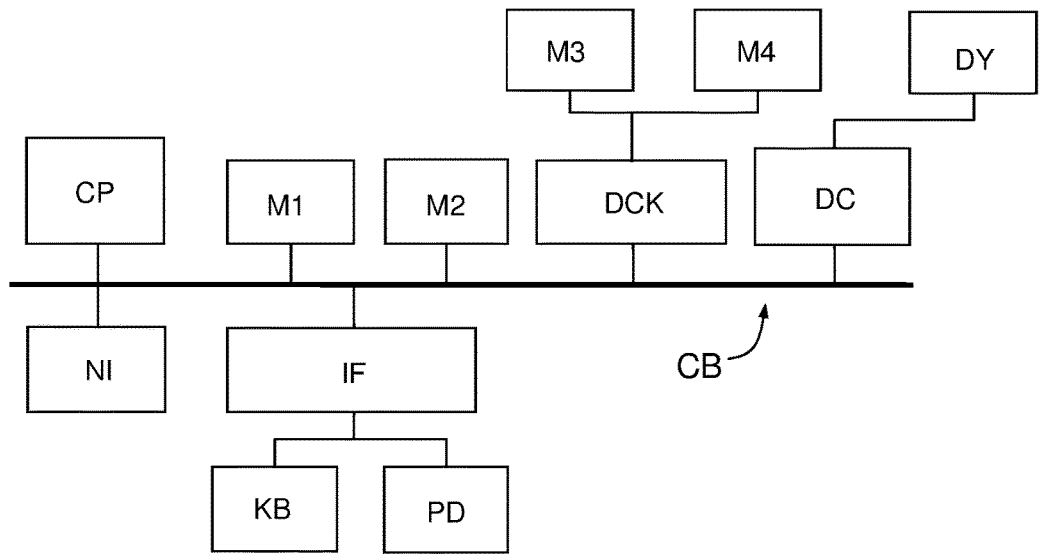
FIGS. 7 and 8 are block diagrams of respective computer systems suitable for carrying out a method according to different embodiments of the invention.

A computer suitable for carrying out a method according to an exemplary embodiment of the present invention is described with reference to FIG. 7. In FIG. 7, the computer includes a Central Processing Unit CPU which performs the processes described above. The process can be stored as an executable program, i.e. a set of computer-readable instructions in memory, such as RAM M1 or ROM M2, or on hard disk drive (HDD) M3, DVD/CD drive M4, or can be stored remotely. Moreover, one or more computer files defining the digital model (avatar) of at least one human or animal body and/or a three-dimensional scene in which said model in immersed may also be stored on one or more of memory devices M1 to M4, or remotely.

The claimed invention is not limited by the form of the computer-readable media on which the computer-readable instructions and/or the digital files of the inventive process are stored. For example, the instructions and files can be stored on CDs, DVDs, in FLASH memory, RAM, ROM, PROM, EPROM, EEPROM, hard disk or any other information processing device with which the Computer Aided Design or illustration authoring station communicates, such as a server or computer. The program and the files can be stored on a same memory device or on different memory devices.

Further, a computer program suitable for carrying out the inventive method can be provided as a utility application, background daemon, or component of an operating system, or combination thereof, executing in conjunction with CPU 800 and an operating system such as Microsoft VISTA, Microsoft Windows 8, UNIX, Solaris, LINUX, Apple MAC-OS and other systems known to those skilled in the art.

The Central Processing Unit CPU can be a Xenon processor from Intel of America or an Opteron processor from AMD of America, or can be other processor types, such as a Freescale ColdFire, IMX, or ARM processor from Freescale Corporation of America. Alternatively, the Central Processing Unit can be a processor such as a Core2 Duo from Intel Corporation of America, or can be implemented on an FPGA, ASIC, PLD or using discrete logic circuits, as one of ordinary skill in the art would recognize. Further, the Central Processing Unit can be implemented as multiple processors cooperatively working to perform the computer-readable instructions of the inventive processes described above.

The computer in FIG. 7 also includes a network interface NI, such as an Intel Ethernet PRO network interface card from Intel Corporation of America, for interfacing with a network, such as a local area network (LAN), wide area network (WAN), the Internet and the like. The Computer Aided Design station further includes a display controller DC, such as a NVIDIA GeForce GTX graphics adaptor from NVIDIA Corporation of America for interfacing with display DY, such as a Hewlett Packard HPL2445w LCD monitor. A general purpose I/O interface IF interfaces with a keyboard KB and pointing device PD, such as a roller ball, mouse, touchpad and the like. The display, the keyboard and the pointing device, together with the display controller and the I/O interfaces, form a graphical user interface, used by the user to provide input commands—e.g. to move the target point, define parameters etc.—and by the Computer Aided Design station for displaying the three-dimensional scene including the avatar.

Disk controller DKC connects HDD M3 and DVD/CD M4 with communication bus CBS, which can be an ISA, EISA, VESA, PCI, or similar, for interconnecting all of the components of the Computer Aided Design station.

A description of the general features and functionality of the display, keyboard, pointing device, as well as the display controller, disk controller, network interface and I/O interface is omitted herein for brevity as these features are known.

Figure 8:
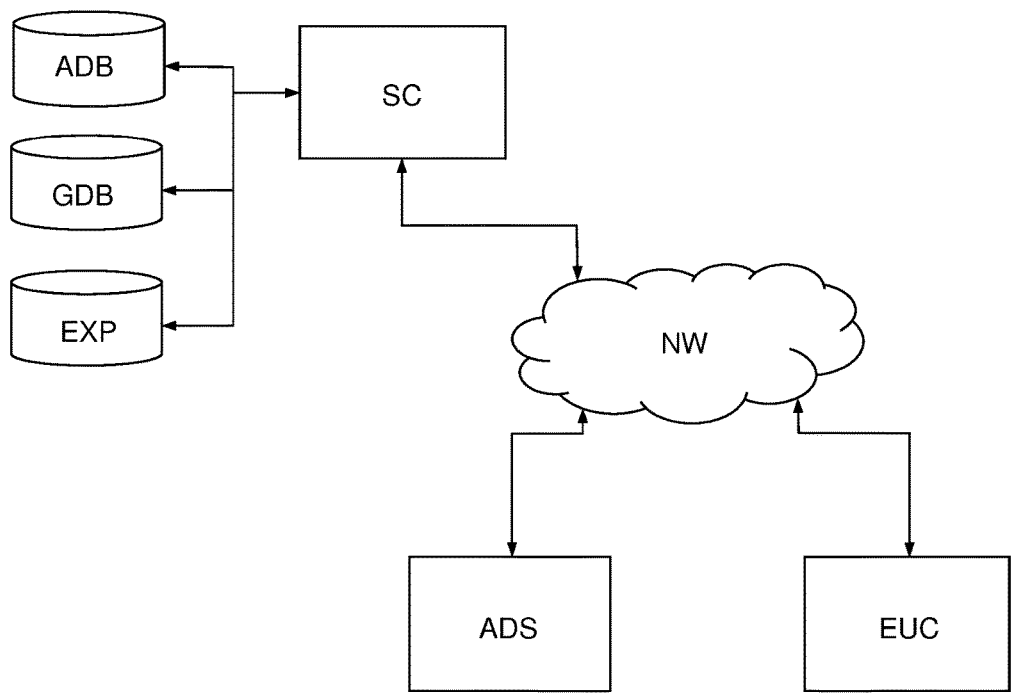

FIG. 8 is a block diagram of a computer system suitable for carrying out a method according to a different exemplary embodiment of the present invention.

In FIG. 8, the executable program EXP and the computer file(s) defining the avatar(s) and possibly the three-dimensional scene are stored on memory devices connected to a server SC. The memory devices and the overall architecture of the server may be the same as discussed above with reference to FIG. 7, except that display controller, display, keyboard and/or pointing device may be missing in the server.

The server SC is then connected to an administrator system ADS and end user computer EUC via a network NW.

The overall architectures of the administrator system and of the end user computer may be the same as discussed above with reference to FIG. 6, except that the memory devices of the administrator system and the end user computer do not store the executable program EXP and/or the computer file(s) defining the avatar and/or the three-dimensional scene. However, the end user computer does store a client program designed for cooperating with the executable program of the server, as it will be discussed below.

As can be appreciated, the network NW can be a public network, such as the Internet, or a private network such as an LAN or WAN network, or any combination thereof and can also include PSTN or ISDN sub-networks. The network NW can also be wired, such as an Ethernet network, or can be wireless such as a cellular network including EDGE, 3G and 4G wireless cellular systems. The wireless network can also be Wi-Fi, Bluetooth, or any other wireless form of communication that is known. Thus, the network NW is merely exemplary and in no way limits the scope of the present advancements.

The client program stored in a memory device of the end user computer and executed by a CPU of the latter accesses, via the network NW, a database DB stored by the server SC and containing files defining three-dimensional scenes or elements thereof. The server performs the processing as described above, and transmits to the end user computer an image file corresponding to the desired representation of the scene, again using the network NW.

Although only one administrator system ADS and one end user system EUX are shown, the system can support any number of administrator systems and/or end user systems without limitation. Similarly, multiple servers can also be implemented in the system without departing from the scope of the present invention Any processes described herein should be understood as representing modules, segments, or portions of code which include one or more executable instructions for implementing specific logical functions or steps in the process, and alternate implementations are included within the scope of the exemplary embodiment of the present invention.

While example embodiments have been particularly shown and described, it will be understood by those skilled in the art that various changes in form and details may be made therein without departing from the scope of the embodiments encompassed by the appended claims.

What is claimed is:

1. A computer-implemented method for simulating a human or animal body taking a posture, comprising the steps of:
    a) providing a model of said human or animal body, including a skeleton comprising a plurality of bones articulated by rotational joints to form at least one kinematic chain, each rotational joint connecting two bones and having a number of rotational axes comprised inclusively between one and three;
    b) defining a starting position and a starting rotational state for each rotational joint of the skeleton, a target position and a bone, called end bone, of a kinematic chain, called active kinematic chain;
    c) for a set of bones of the active kinematic chain, including the end bone, defining at least one axis having a fixed orientation with respect to the bone;
    d) determining a first posture of the body by:
        d1) selecting a first ordered list of rotational joints of the active kinematic chain, a rotational axis for each of said rotational joints, a bone articulated by each of said rotational joints, and an axis for each of said bones;
        d2) for each of said rotational axes, defining a maximal fractional contribution to a target rotation and a maximal rotation angle, wherein the maximal fractional contribution is a percentage of a full rotation to reach the target rotation; and d3) applying to each of the selected rotational joints, taken in the order of the list, a rotation about the corresponding rotational axis in order to direct the selected axis of the corresponding bone toward the target position, the rotation being bounded by one among the corresponding maximal rotation angle and the corresponding maximal fractional contribution to the target rotation which orientate the selected axis exactly toward the target; and e) determining a second posture of the body by:

e1) selecting an axis of the end bone;

e2) selecting a second ordered list of rotational joints of the active kinematic chain;

e3) for each of said rotational joints of the second ordered list, defining a rotational axis, a maximal fractional contribution to a target rotation and a maximal rotation angle, wherein the maximal fractional contribution is a percentage of a full rotation to reach the target rotation; and e4) iteratively applying to each of the selected rotational joints, taken in the order of the list, a rotation about the corresponding rotational axis in order to direct the selected axis of the end bone toward the target position, the rotation being bounded by the largest among the corresponding maximal rotation angle and the corresponding maximal fractional contribution to the target rotation which orientate the axis exactly toward the target and which minimize the distance between the effector and its target position.

2. The computer-implemented method of claim 1 wherein, in step d3) each rotation of a joint about a rotational axis is bounded by the largest among the corresponding maximal rotation angle and of the corresponding maximal fractional contribution to the target rotation which minimize the distance between the effector and its target position.

3. The computer-implemented method of claim 1 wherein in step e) at least one rotation is bounded by at least one constraint modeling a physiological constraint of the human or animal body.

4. The computer-implemented method of claim 3 further comprising the following step, carried out after step e):

f) applying rotations of the joints of the active kinematic list, only bounded by said, or each said, constraint modeling a physiological constraint of the human or animal body, to orientate the selected axis of the end bone exactly toward the target.

5. The computer-implemented method of claim 1, wherein said target is moving in a three-dimensional space containing the model of said human or animal body, and wherein step e) is repeatedly carried out, in real time, for a plurality of successive positions of the target.

6. The computer-implemented method of claim 1 further comprising displaying a graphical representation of said human or animal body.

7. The computer-implemented method of claim 1, wherein the selected axis (GZ) of the end bone represents a gaze direction of said human or animal body.

8. A computer program product, comprising:

a non-transitory computer-readable data-storage medium having computer-executable instructions stored thereon, the instructions causing a computer system to:

a) provide a model of said human or animal body, including a skeleton comprising a plurality of bones articulated by rotational joints to form at least one kinematic chain, each rotational joint connecting two bones and having a number of rotational axes comprised inclusively between one and three;

b) define a starting position and a starting rotational state for each rotational joint of the skeleton, a target position and a bone, called end bone, of a kinematic chain, called active kinematic chain;

c) for a set of bones of the active kinematic chain, including the end bone, define at least one axis having a fixed orientation with respect to the bone;

d) determine a first posture of the body by:

d1) selecting a first ordered list of rotational joints of the active kinematic chain, a rotational axis for each of said rotational joints, a bone articulated by each of said joints and an axis for each of said bones;

d2) for each of said rotational axes, defining a maximal fractional contribution to a target rotation and a maximal rotation angle, wherein the maximal fractional contribution is a percentage of a full rotation to reach the target rotation; and d3) applying to each of the selected rotational joints, taken in the order of the list, a rotation about the corresponding rotational axis in order to direct the selected axis of the corresponding bone toward the target position, the rotation being bounded by one among the corresponding maximal rotation angle and the corresponding maximal fractional contribution to the target rotation which orientate the selected axis exactly toward the target; and e) determine a second posture of the body by:

e1) selecting an axis of the end bone;

e2) selecting a second ordered list of rotational joints of the active kinematic chain, wherein the maximal fractional contribution is a percentage of a full rotation to reach the target rotation;

e3) for each of said rotational joints of the second ordered list, defining a rotational axis, a maximal fractional contribution to a target rotation and a maximal rotation angle, wherein the maximal fractional contribution is a percentage of a full rotation to reach the target rotation; and e4) iteratively applying to each of the selected rotational joints, taken in the order of the list, a rotation about the corresponding rotational axis in order to direct the selected axis of the end bone toward the target position, the rotation being bounded by a largest of the corresponding maximal rotation angle and the corresponding maximal fractional contribution to the target rotation which orientate the axis exactly toward the target and which minimize the distance between the effector and its target position.

9. A non-transitory computer-readable data-storage medium, comprising:

a memory area containing computer-executable instructions to cause a computer system to:

a) provide a model of said human or animal body, including a skeleton comprising a plurality of bones articulated by rotational joints to form at least one kinematic chain, each rotational joint connecting two bones and having number of rotational axes comprised inclusively between one and three;

b) define a starting position and a starting rotational state for each rotational joint of the skeleton, a target position and a bone, called end bone, of a kinematic chain, called active kinematic chain;

c) for a set of bones of the active kinematic chain, including the end bone, define at least one axis having a fixed orientation with respect to the bone;

d) determine a first posture of the body by:
  d1) selecting a first ordered list of joints of the active kinematic chain, a rotational axis for each of said rotational joints, a bone articulated by each of said joints and an axis for each of said bones;
  d2) for each of said rotational axes, defining a maximal fractional contribution to a target rotation and a maximal rotation angle, wherein the maximal fractional contribution is a percentage of a full rotation to reach the target rotation; and
  d3) applying to each of the selected rotational joints, taken in the order of the list, a rotation about the corresponding rotational axis in order to direct the selected axis of the corresponding bone toward the target, the rotation being bounded by one among the corresponding maximal rotation angle and the corresponding maximal fractional contribution to the target rotation which orientate the selected axis exactly toward the target; and e) determine a second posture of the body by:
  e1) selecting an axis of the end bone;
  e2) selecting a second ordered list of joints of the active kinematic chain;
  e3) for each of said rotational joints, defining a rotational axis, a maximal fractional contribution to a target rotation and a maximal rotation angle, wherein the maximal fractional contribution is a percentage of a full rotation to reach the target rotation; and
  e4) iteratively applying to each of the selected rotational joints, taken in the order of the list, a rotation about the corresponding rotational axis in order to direct the selected axis of the end bone toward the target, the rotation being bounded by a largest of the corresponding maximal rotation angle and the corresponding maximal fractional contribution to the target rotation which orientate the axis exactly toward the target and which minimize the distance between the effector and its target position.

10. A computer system comprising:
a processor coupled to a memory and a graphical user interface,
the memory storing computer-executable instructions that cause the computer system to:
a) provide a model of said human or animal body, including a skeleton comprising a plurality of bones articulated by rotational joints to form at least one kinematic chain, each rotational joint connecting two bones and having a number of rotational axes comprised between one and three;

b) define a starting position and a starting rotational state for each rotational joint of the skeleton, a target position and a bone, called end bone, of a kinematic chain, called active kinematic chain;

c) for a set of bones of the active kinematic chain, including the end bone, define at least one axis having a fixed orientation with respect to the bone;

d) determine a first posture of the body by:
  d1) selecting a first ordered list of joints of the active kinematic chain, a rotational axis for each of said rotational joints, a bone articulated by each of said joints and an axis for each of said bones;
  d2) for each of said rotational axes, defining a maximal fractional contribution to a target rotation and a maximal rotation angle, wherein the maximal fractional contribution is a percentage of a full rotation to reach the target rotation; and
  d3) applying to each of the selected rotational joints, taken in the order of the list, a rotation about the corresponding rotational axis in order to direct the selected axis of the corresponding bone toward the target, the rotation being bounded by one among the corresponding maximal rotation angle and the corresponding maximal fractional contribution to the target rotation which orientate the selected axis exactly toward the target; and e) determine a second posture of the body by:
  e1) selecting an axis of the end bone;
  e2) selecting a second ordered list of joints of the active kinematic chain;
  e3) for each of said rotational joints, defining a rotational axis, a maximal fractional contribution to a target rotation and a maximal rotation angle, wherein the maximal fractional contribution is a percentage of a full rotation to reach the target rotation; and
  e4) iteratively applying to each of the selected rotational joints, taken in the order of the list, a rotation about the corresponding rotational axis in order to direct the selected axis of the end bone toward the target, the rotation being bounded by a largest of the corresponding maximal rotation angle and the corresponding maximal fractional contribution to the target rotation which orientate the axis exactly toward the target and which minimize the distance between the effector and its target position.

11. A non-transitory computer readable medium comprising a model of a human or animal body configured to take a posture simulated with the method of claim 1.

* * * * *